US009800090B2

(12) United States Patent
Heidenreich et al.

(10) Patent No.: US 9,800,090 B2
(45) Date of Patent: Oct. 24, 2017

(54) UNINTERRUPTIBLE POWER SUPPLY SYSTEMS AND METHODS FOR COMMUNICATION SYSTEMS

(71) Applicant: Alpha Technologies Inc., Bellingham, WA (US)

(72) Inventors: Jim Heidenreich, Bellingham, WA (US); Toby Peck, Bellingham, WA (US); Craig Paoli, Bellingham, WA (US); Peter Schmidt, Bellingham, WA (US); Greg Thomas, Bellingham, WA (US); John Rodgers, Bellingham, WA (US)

(73) Assignee: Alpha Technologies Inc., Bellingham, WA (US)

(*) Notice: Subject to any disclaimer, the term of this patent is extended or adjusted under 35 U.S.C. 154(b) by 329 days.

(21) Appl. No.: 14/710,421

(22) Filed: May 12, 2015

(65) Prior Publication Data

US 2015/0244212 A1 Aug. 27, 2015

Related U.S. Application Data

(63) Continuation of application No. 13/275,272, filed on Oct. 17, 2011, now Pat. No. 9,030,048.

(Continued)

(51) Int. Cl.
*H02J 1/00* (2006.01)
*H02J 9/06* (2006.01)

(52) U.S. Cl.
CPC ......... *H02J 9/062* (2013.01); *H02J 2009/063* (2013.01); *H02J 2009/067* (2013.01); *Y10T 307/62* (2015.04); *Y10T 307/625* (2015.04)

(58) Field of Classification Search
CPC ................................................ H02J 2009/067
See application file for complete search history.

(56) References Cited

U.S. PATENT DOCUMENTS 3,944,837 A 3/1976 Meyers et al.
4,063,963 A 12/1977 Bond, Jr.
(Continued)

FOREIGN PATENT DOCUMENTS

AU 687528 2/1998
CA 1265231 1/1990
(Continued)

OTHER PUBLICATIONS

Boehringer, "Self-adapting dc Converter for Solar Spacecraft Power Supply," IEEE Transactions on Aerospace and Electronic Systems, vol. AES-4, No. 1, Jan. 1968, pp. 102-111.
(Continued)

*Primary Examiner* — Daniel Cavallari
(74) *Attorney, Agent, or Firm* — Michael R. Schacht; Schacht Law Office, Inc.

(57) ABSTRACT

An uninterruptible power supply to be connected between an AC line and a load has a battery system, an inverter, a transformer, and a controller. The battery system stores battery power. The inverter is operatively connected to the battery system. The transformer comprises a primary winding adapted to be connected to the AC line, a load winding adapted to be connected to the load, and an inverter winding operatively connected to the inverter. The controller controls the inverter to operate in a first mode in which the inverter supplies power to the battery system, a second mode in which the inverter supplies power to the load winding using battery power stored in the battery system, and a third mode in which the inverter supplies power to the primary winding using battery power stored in the battery system.

20 Claims, 6 Drawing Sheets

Related U.S. Application Data

(60) Provisional application No. 61/394,300, filed on Oct. 18, 2010.

(56) References Cited

U.S. PATENT DOCUMENTS

| | | | |
|---|---|---|---|
| 4,262,209 | A | 4/1981 | Berner |
| 4,731,547 | A | 3/1988 | Alenduff et al. |
| 5,228,924 | A | 7/1993 | Barker et al. |
| 5,410,720 | A | 4/1995 | Osterman |
| 5,532,525 | A | 7/1996 | Kaiser et al. |
| 5,638,244 | A | 6/1997 | Mekanik et al. |
| 5,642,002 | A | 6/1997 | Mekanik et al. |
| 5,739,595 | A | 4/1998 | Mekanik et al. |
| 5,760,495 | A | 6/1998 | Mekanik |
| 5,856,712 | A | 1/1999 | Suzuki et al. |
| 5,949,662 | A | 9/1999 | Boldin et al. |
| 5,961,604 | A | 10/1999 | Anderson et al. |
| 5,982,645 | A | 11/1999 | Levran et al. |
| 6,014,015 | A | 1/2000 | Thorne et al. |
| 6,093,885 | A | 7/2000 | Takehara et al. |
| 6,198,177 | B1 | 3/2001 | Mao et al. |
| 6,201,371 | B1 | 3/2001 | Kawabe et al. |
| 6,288,916 | B1 | 9/2001 | Liu et al. |
| 6,483,730 | B2 | 11/2002 | Johnson, Jr. |
| 6,486,399 | B1 | 11/2002 | Armstrong et al. |
| 6,542,791 | B1 | 4/2003 | Perez |
| 6,602,627 | B2 | 8/2003 | Liu et al. |
| 6,605,879 | B2 | 8/2003 | Wade et al. |
| 6,841,971 | B1 | 1/2005 | Spee et al. |
| 6,933,626 | B2 | 8/2005 | Oughton, Jr. |
| 7,040,920 | B2 | 5/2006 | Johnson, Jr. et al. |
| 7,050,312 | B2 | 5/2006 | Tracy et al. |
| 7,182,632 | B1 | 2/2007 | Johnson, Jr. et al. |
| 7,449,798 | B2 | 11/2008 | Suzuki et al. |
| 7,567,520 | B2 | 7/2009 | Ostrosky |
| 7,746,669 | B2 | 6/2010 | Falk |
| 7,800,922 | B2 * | 9/2010 | Takayanagi ............ H02M 1/10 323/251 |
| RE43,572 | E | 8/2012 | West |
| 9,030,048 | B2 | 5/2015 | Heidenreich et al. |
| 9,087,338 | B2 | 7/2015 | LeVine et al. |
| 9,348,394 | B2 | 5/2016 | Harper et al. |
| 2003/0038610 | A1 | 2/2003 | Munshi et al. |
| 2003/0047209 | A1 | 3/2003 | Yanai et al. |
| 2003/0117822 | A1 | 6/2003 | Stamenic et al. |
| 2007/0159858 | A1 * | 7/2007 | Spindler ................. H02J 3/28 363/37 |
| 2007/0194759 | A1 | 8/2007 | Shimizu et al. |
| 2007/0199336 | A1 | 8/2007 | Tantot |
| 2008/0197122 | A1 | 8/2008 | Gober |
| 2009/0194145 | A1 | 8/2009 | Kribus et al. |
| 2010/0017045 | A1 | 1/2010 | Nesler et al. |
| 2010/0109601 | A1 | 5/2010 | Coyle et al. |
| 2010/0169008 | A1 | 7/2010 | Niwa et al. |
| 2010/0279455 | A1 | 11/2010 | Seemann |
| 2010/0318297 | A1 | 12/2010 | Herzig et al. |
| 2011/0068624 | A1 | 3/2011 | Dibachi et al. |
| 2011/0087379 | A1 | 4/2011 | Savelle et al. |
| 2011/0100004 | A1 | 5/2011 | Al-Mazeedi |
| 2011/0198932 | A1 | 8/2011 | Le et al. |
| 2011/0204720 | A1 | 8/2011 | Ruiz et al. |
| 2012/0091811 | A1 | 4/2012 | Heidenreich et al. |
| 2013/0056170 | A1 | 3/2013 | Klemencic |

FOREIGN PATENT DOCUMENTS

| | | |
|---|---|---|
| CA | 2033685 | 10/1991 |
| CA | 2036296 | 11/1991 |
| CA | 1297546 | 3/1992 |
| CA | 2086897 | 7/1993 |
| CA | 2028269 | 1/2000 |
| CA | 2149845 | 2/2000 |
| CA | 2168520 | 4/2003 |
| CA | 2403888 | 5/2007 |
| CA | 2713017 | 7/2009 |
| CA | 2504101 | 5/2010 |
| CA | 2760581 | 11/2010 |
| DE | 93027567 | 5/1993 |
| EP | 0827254 | 3/1998 |
| EP | 2425515 | 3/2012 |
| GB | 2355350 | 4/2001 |
| JP | 61165051 | 10/1986 |
| JP | 2000023365 | 1/2000 |
| JP | 2001190035 A | 7/2001 |
| JP | 2004296547 | 10/2004 |
| JP | 3142899 | 6/2008 |
| KR | 2019990000402 | 1/1999 |
| KR | 1020070004478 | 1/2007 |
| KR | 1020070078524 | 8/2007 |
| WO | 2007129808 | 11/2007 |
| WO | 2009094540 | 7/2009 |
| ZA | 0931273 | 2/1993 |

OTHER PUBLICATIONS

Enslin, "Maximum Power Point Tracking: A Cost Saving Necessity in Solar Energy Systems" Renewable Energy vol. 2, No. 6, 1992, pp. 543-549.
Enslin, Wolf, Snyman, Swiegers, "Integrated Photovoltaic Maximum Power Point Tracking Converter", IEEE Transactions on Industrial Electronics, vol. 44, No. 6, Dec. 1997, pp. 769-773.
PCT International Search Report, International Application No. PCT/US2010/032832, Dec. 2, 2010, 10 pages.
PCT International Search Report, International Application No. PCT/US2009/031836, Aug. 18, 2009, 12 pages.
PCT International Search Report, International Application No. PCT/US2011/056597, Jan. 11, 2012, 12 pages.
Schacht Law Office, Inc., U.S. Appl. No. 12/770,278 Response to Office Action, Apr. 23, 2012, 9 pages.
Schoeman, Van Wyk, "A Simplified Maximal Power Controller for Terrestrial Photovoltaic Panel Arrays", 13th Annual IEEE Power Electronics Specialists Conference (PESC '82 Record), Jun. 1982, pp. 361-367, Cambridge, MA.
Snyman, Enslin, "An Experimental Evaluation of MPPT Converter Topologies for PV Installations", Renewable Energy, vol. 3, No. 8, 1993, pp. 841-848.
U.S. Appl. No. 12/358,496 Office Action, Sep. 23, 2011, 14 pages.
U.S. Appl. No. 12/770,278 Office Dec. 22, 2011, 25 pages.
USPTO, "Non-final Office Action, U.S. Appl. No. 141/16,686", Aug. 23, 2017, 27 pages.

* cited by examiner

UNINTERRUPTIBLE POWER SUPPLY SYSTEMS AND METHODS FOR COMMUNICATION SYSTEMS

RELATED APPLICATIONS

This application, is a continuation of U.S. application Ser. No. 13/275,272, filed Oct. 17, 2011, now pending.

U.S. application Ser. No. 13/275,272 claims benefit of U.S. Provisional Patent Application Ser. No. 61/394,300, filed Oct. 18, 2010.

The contents of the application(s) listed above are incorporated herein by reference.

FIELD OF THE INVENTION

The present invention relates to uninterruptible power supplies for use in communications systems and, more specifically, to uninterruptible power supplies having sporadically used energy production and/or storage systems.

BACKGROUND

UPS systems are often designed to be used to provide power to a larger communications system based on an AC utility power signal generated by an electric utility. Examples of communications systems that might use such UPS systems are cable TV (CATV) systems, telephony systems, and cellular telephone systems. Typically, a large number of the UPS systems will be distributed throughout the communications system.

In a typical UPS system designed to provide power to a primary load, the battery array is used only when the utility power signal is not present or out of predetermined parameters, and the battery array may be unused for long periods of time. The battery arrays distributed throughout a typical large communications system are a relatively expensive asset of such communications systems.

The need exists for improved UPS systems and methods that make better use of the existing assets forming a communications system.

SUMMARY

The present invention may be embodied as an uninterruptible power supply to be connected between an AC line and a load. The example uninterruptible power supply comprises a battery system, an inverter, a transformer, and a controller. The battery system stores battery power. The inverter is operatively connected to the battery system. The transformer comprises a primary winding adapted to be connected to the AC line, a load winding adapted to be connected to the load, and an inverter winding operatively connected to the inverter. The controller controls the inverter to operate in a first mode in which the inverter supplies power to the battery system, a second mode in which the inverter supplies power to the load winding using battery power stored in the battery system, and a third mode in which the inverter supplies power to the primary winding using battery power stored in the battery system.

The present invention may also be embodied as a method of supplying uninterruptible electric power to a load comprising the following steps. A battery system for storing battery power is provided. An inverter is operatively connected to the battery system. A transformer comprising a primary winding configured to be connected to an AC line, a load winding configured to be connected to the load, and an inverter winding is provided. The inverter winding is operatively connected to the inverter. The inverter is controlled to operate in a first mode in which the inverter supplies power to the battery system from the primary winding, a second mode in which the inverter supplies power to the load winding using battery power stored in the battery system, and a third mode in which the inverter supplies power to the primary winding using battery power stored in the battery system.

The present invention may also be embodied as an uninterruptible power supply adapted to be connected between an AC line and a load comprising a battery system for storing battery power, an inverter operatively connected to the battery system, a transformer, and a controller. The transformer comprises a primary winding adapted to be connected to the AC line, a load winding adapted to be connected to the load, and an inverter winding operatively connected to the inverter. The controller controls the inverter to operate based on at least one characteristic of a primary power signal present at the primary winding in a first mode in which the inverter supplies power to the battery system, a second mode in which the inverter supplies power to the load winding using battery power stored in the battery system, and a third mode in which the inverter supplies power to the primary winding using battery power stored in the battery system.

DETAILED DESCRIPTION

Figure 1:
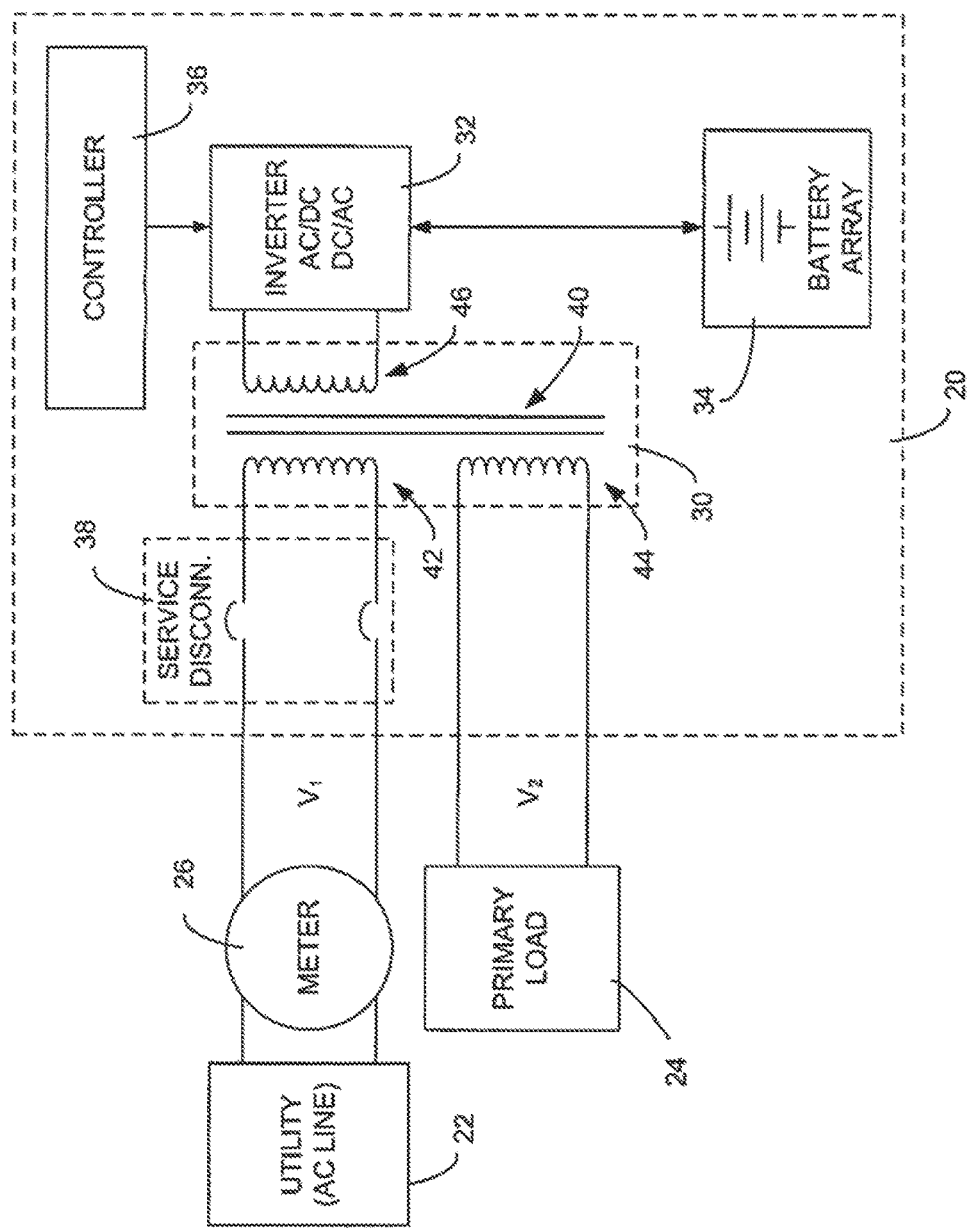
FIG. 1 is a block diagram of a first example uninterruptible power supply (UPS) of the present invention.

Referring initially to FIG. 1 of the drawing, depicted therein is a first example UPS system 20 constructed in accordance with, and embodying, the principles of the present invention. The example UPS system 20 is adapted to obtain power from and supply power to a utility 22 and also to provide power to a primary load 24. As depicted in FIG. 1, a meter 26 may be connected between the utility 22 and the first example UPS system 20.

The first example UPS system 20 is designed to be used to provide power to a larger communications system (partly represented in FIG. 1 by the primary load) based on an AC utility power signal generated by an electric utility. Examples of communications systems that might use the UPS system 20 are cable TV (CATV) systems, telephony systems, and cellular telephone systems.

Typically, a large number of the UPS systems such as the example UPS system 20 will be distributed throughout the communications system. In general, a plurality (two or more) and typically tens or hundreds of the first example UPS systems will be located where utility power is available and distributed throughout the communications system as necessary to provide an appropriate power signal to components of the communications system. Only the example UPS system 20 is depicted in FIG. 1 for purposes of clarity.

Typically, but not necessarily, the utility 22 operates at a standard voltage ($V_1$), while the primary load 24 operates at a different voltage level ($V_2$) than the utility 22. When the voltages $V_1$ and $V_2$ are different, a transformer 30 thus steps the voltage up or down as necessary to perform the functions described below. In addition, the primary load 24 may operate in some environments (e.g., CATV systems) based on an AC power signal and in other environments (e.g., telephony systems) based on a DC power signal. As is conventional, the battery array 34 is one or more batteries that employ a DC power signal. While batteries currently represent the most conventional manner of storing power for the generation of electricity, other power storage systems may be used as will be generally discussed in further detail below.

The first example UPS system 20 comprises the transformer 30, an inverter circuit 32, a battery array 34, a controller 36, and a service disconnect 38. The service disconnect 38 may be operated to disconnect the transformer from the utility 22. The transformer 30 comprises a core 40, a first winding 42, a second winding 44, and an third winding 46.

The first example UPS system 20 may be configured to operate in one or more of at least three operating modes. In a first (primary) operating mode, the UPS system 20 supplies power to the primary load 24 and charges the battery array 34 using power from the utility 22. In a second (standby) operating mode, the UPS system 20 supplies power to the primary load 24 using power stored in the battery array 34. In a third operating (peak shaving) mode, the UPS system 20 supplies power to the utility 22 using power stored in the battery array 34. In the first example UPS system 20, the controller 36 determines whether the UPS system operates in the first, second, or third modes.

In a typical UPS system designed to provide power to a primary load, the battery array is used only when the utility power signal is not present or out of predetermined parameters, and the battery array may be unused for long periods of time. The provision of the third operating mode allows the operator of the first example UPS system to optimize the use of assets (e.g., batteries) that otherwise typically are unused for long periods of time. In particular, the operator of the first example UPS system 20 can charge the battery array 34 using utility power during off-peak utility hours when power prices are relatively cheap and, during peak utility hours when power prices are relatively expensive, sell power back to the utility by discharging the battery array 34. The operator of the communications system incorporating the first example UPS system 20 may thus profit on the difference between peak and off peak prices for electrical power.

In a typical UPS system designed to provide power to a primary load, the battery array is comprised of batteries optimized for continuous charging and infrequent discharging. While such batteries may be used in the first example UPS system 20, the example battery array 34 of the first example UPS system 20 is preferably comprised of deep cycle batteries optimized for frequent charging and discharging. The use of deep cycle batteries in the example battery array 34 allows the first example UPS system to operate in the third operating mode on a frequent (e.g., daily) basis without seriously adversely affecting the life of the batteries forming the battery array 34.

However, even deep cycle batteries may be charged and discharged a limited number of times before replacement is required, so the charging and discharging of the battery array 34 represents a cost to the operator of the first example UPS system 20. Additionally, the costs of replacing particular batteries (e.g., remote or difficult to access) may be factored into the cost of operating particular battery arrays 34 in the communications system. Accordingly, the cost to the operator of the communications system operating the first example UPS system 20 in terms of reduced battery life may be considered when the controller 36 places the UPS system 20 in the third operating mode. In particular, the controller 36 may be programmed to place the UPS system in the third operating mode only if the difference between the peak and off-peak electricity prices is sufficiently high to justify incrementally reducing the life of the batteries forming the example battery array 34.

Figure 2:
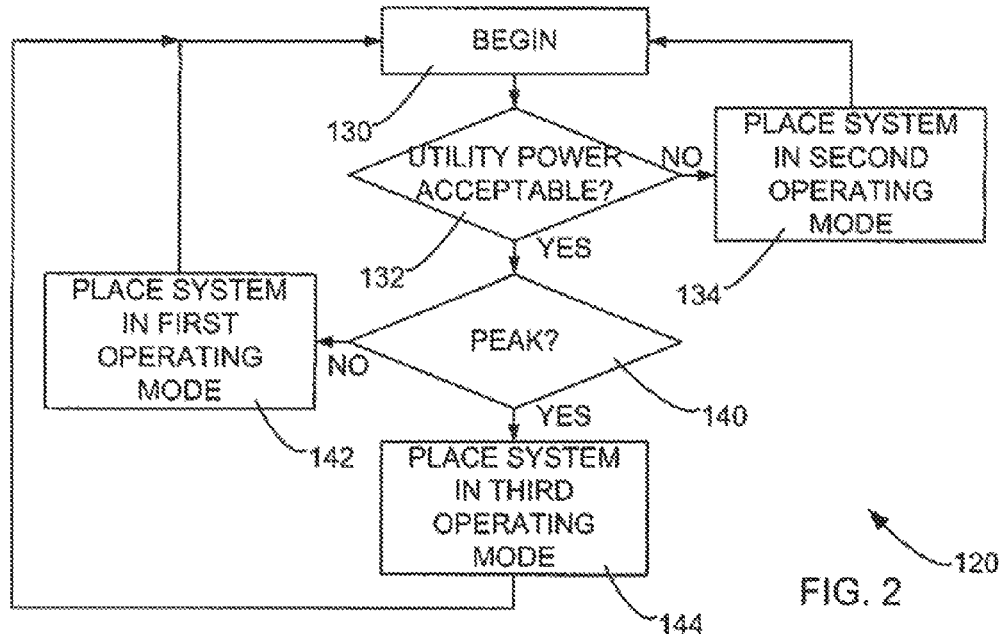
FIG. 2 is a flow chart illustrating a first example of control logic for controlling the operation of the first example UPS to perform peak shaving.

Referring now to FIG. 2 of the drawing, depicted therein is a first example method 120 that may be implemented by the controller 36 of the first example UPS system 20. The first example method 120 begins at a initial step 130 and initially proceeds to a step 132 which determines whether the utility power signal generated by the utility 22 is within certain predetermined conditions (i.e., acceptable). If not, the method 120 places the UPS system 20 in the second operating mode at step 134 and returns to the initial step 130.

If the utility power signal generated by the utility 22 is within the predetermined conditions, the method 120 moves to step 140, which determines whether the utility 22 is supplying power at peak or non-peak rates. If the utility 22 is supplying power at non-peak rates, the method 120 places the system 20 in the first operating mode at step 142 and then returns to the initial step 130. If the utility 22 is supplying power at peak rates, the method 120 places the system 20 in the third operating mode at step 144 and then returns to the initial step 130.

The first example method 120 thus places primary emphasis on causing the UPS system 20 to provide standby power to the primary load 24 in the second operating mode when the utility power signal is unacceptable but causes the UPS system 20 to operate in either the first operating mode (e.g., charging batteries with relatively cheap power) during non-peak time periods or in the third operating mode (e.g., selling power back to the utility) during peak time periods.

Figure 3:
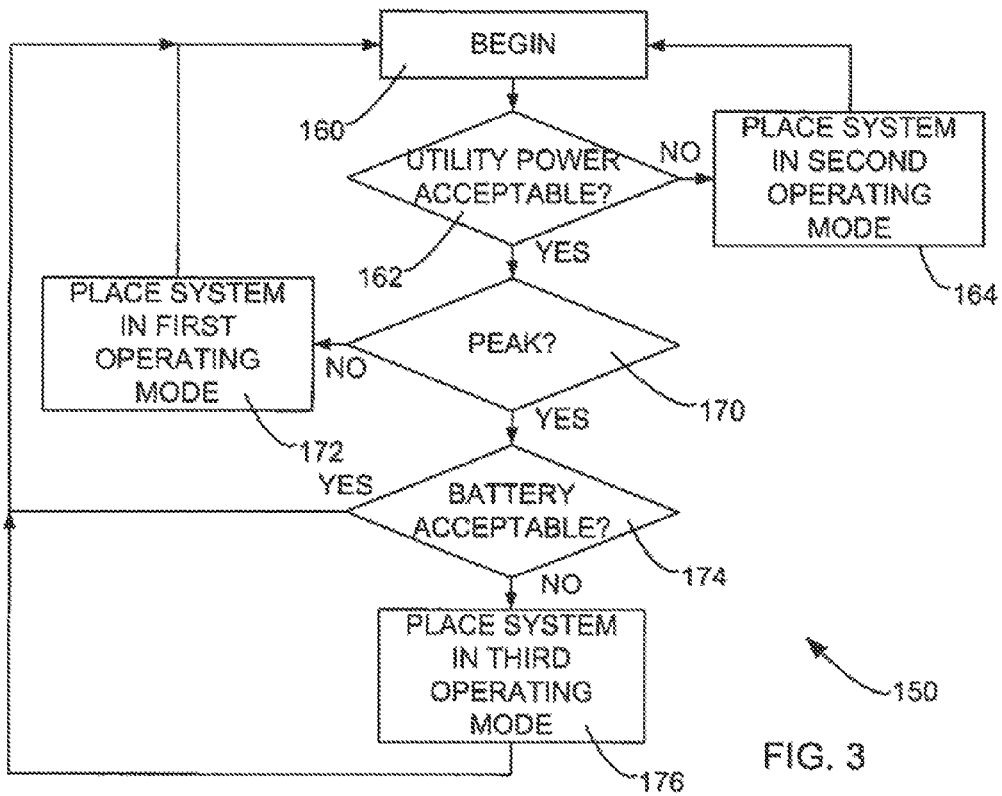
FIG. 3 is a flow chart illustrating a second example of control logic for controlling the operation of the first example UPS to perform peak shaving.

Referring now to FIG. 3 of the drawing, depicted therein is a second example method 150 that may be implemented by the controller 36 of the first example UPS system 20. The second example method 150 begins at a initial step 160 and initially proceeds to a step 162 which determines whether the utility power signal generated by the utility 22 is within certain predetermined conditions (i.e., acceptable). If not, the method 150 places the UPS system 20 in the second operating mode at step 164 and returns to the initial step 160.

If the utility power signal generated by the utility 22 is within the predetermined conditions, the method 150 moves to step 170, which determines whether the utility 22 is supplying power at peak or non-peak rates. If the utility 22 is supplying power at non-peak rates, the method 150 places the system 20 in the first operating mode at step 172 and then returns to the initial step 160.

If the utility 22 is supplying power at peak rates, the second example method 150 proceeds to a step 174 at which it is determined whether the example battery array 34 is within predetermined parameters. As one example, the charge on the battery array 34 may be too low to provide adequate standby power to the primary load 24 should the utility power signal should become unacceptable. As other examples, the age of the battery array 34 or operating conditions (temperature, humidity, etc.) may be inappropriate for using the battery array 34 for any purpose other than providing standby power to the primary load 22. In any of these situations, the method 150 returns to the initial step 160 and does not place the example UPS system 20 into the third operating mode.

If, on the other hand, the example battery array 34 is within the predetermined parameters, the method 150 places the system 20 in the third operating mode at step 176 and then returns to the initial step 160.

The second example method 150 thus places even more emphasis on causing the UPS system 20 to provide standby power to the primary load 24 by preventing the UPS system 20 from operating in the third operating mode if the battery array 34 is outside of certain predetermined parameters. Only when the condition of the battery array 34 is appropriate for use in peak shaving will the method 150 place the UPS system 20 in the third operating mode. Otherwise, the second example method 150 causes the UPS system 20 to operate in either the first operating mode (e.g., charging batteries with relatively cheap power) during non-peak time periods or in the third operating mode (e.g., selling power back to the utility) during peak time periods.

Figure 4:
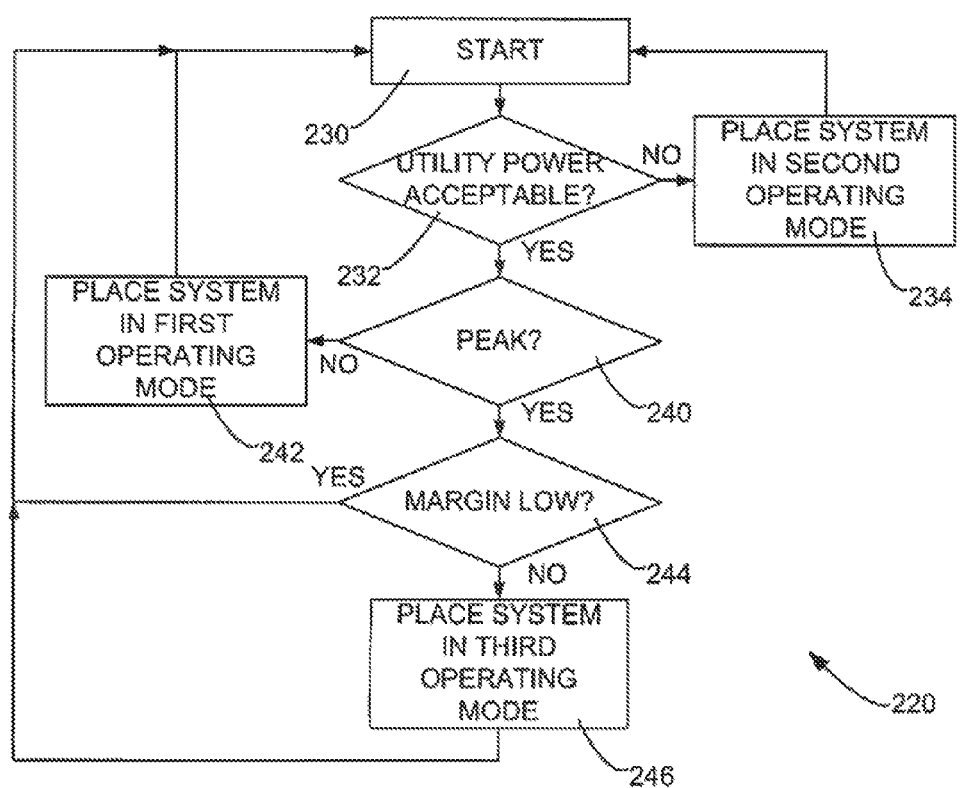
FIG. 4 is a flow chart illustrating a third example of control logic for controlling the operation of the first example UPS to perform peak shaving.

Referring now to FIG. 4 of the drawing, depicted therein is a third example method 220 that may be implemented by the controller 36 of the first example UPS system 20. The third example method 220 begins at a initial step 230 and initially proceeds to a step 232 which determines whether the utility power signal generated by the utility 22 is within certain predetermined conditions (i.e., acceptable). If not, the method 220 places the UPS system 20 in the second operating mode at step 234 and returns to the initial step 230.

If the utility power signal generated by the utility 22 is within the predetermined conditions, the method 220 moves to step 240, which determines whether the utility 22 is supplying power at peak or non-peak rates. If the utility 22 is supplying power at non-peak rates, the method 220 places the system 20 in the first operating mode at step 242 and then returns to the initial step 230.

If the utility 22 is supplying power at peak rates, the second example method 150 proceeds to a step 244 at which it is determined whether a profit margin, or difference between peak and non-peak rates, is sufficient to justify the discharge/charge cycle required to sell power back to the utility 22. As generally discussed above, each charge and discharge cycle reduces the overall life of the batteries forming the battery array 34. This reduction in overall life of the battery array can be quantified and compared with the possible revenue derived from selling energy back to the utility 22. If step 174 determines that this margin is too low to justify the reduction in battery life, the method 220 returns to the initial step 230 and does not place the example UPS system 20 into the third operating mode.

If, on the other hand, the margin is within predetermined parameters (e.g., above a minimum), the method 220 places the system 20 in the third operating mode at step 246 and then returns to the initial step 230.

The third example method 220 thus takes into account additional variables when determining whether selling power back to the utility 22 is justified. Only when the profit margin exceeds the cost associated with charging and discharging the battery will the method 220 place the UPS system 20 in the third operating mode. Otherwise, the second example method 150 causes the UPS system 20 to operate in either the first operating mode (e.g., charging batteries with relatively cheap power) during non-peak time periods or in the third operating mode (e.g., selling power back to the utility) during peak time periods.

In addition, the third example method 220 may be modified to incorporate the step 174 of the second example method 150 to allow even more sophisticated control of the first example UPS system 20. Employing both the step 174 and the step 244 allows the first example UPS system 20 to prevent the UPS system 20 from operating in the third operating mode if the battery array 34 is outside of certain predetermined parameters and/or if the profit margin exceeds the cost associated with charging and discharging the battery.

Figure 5:
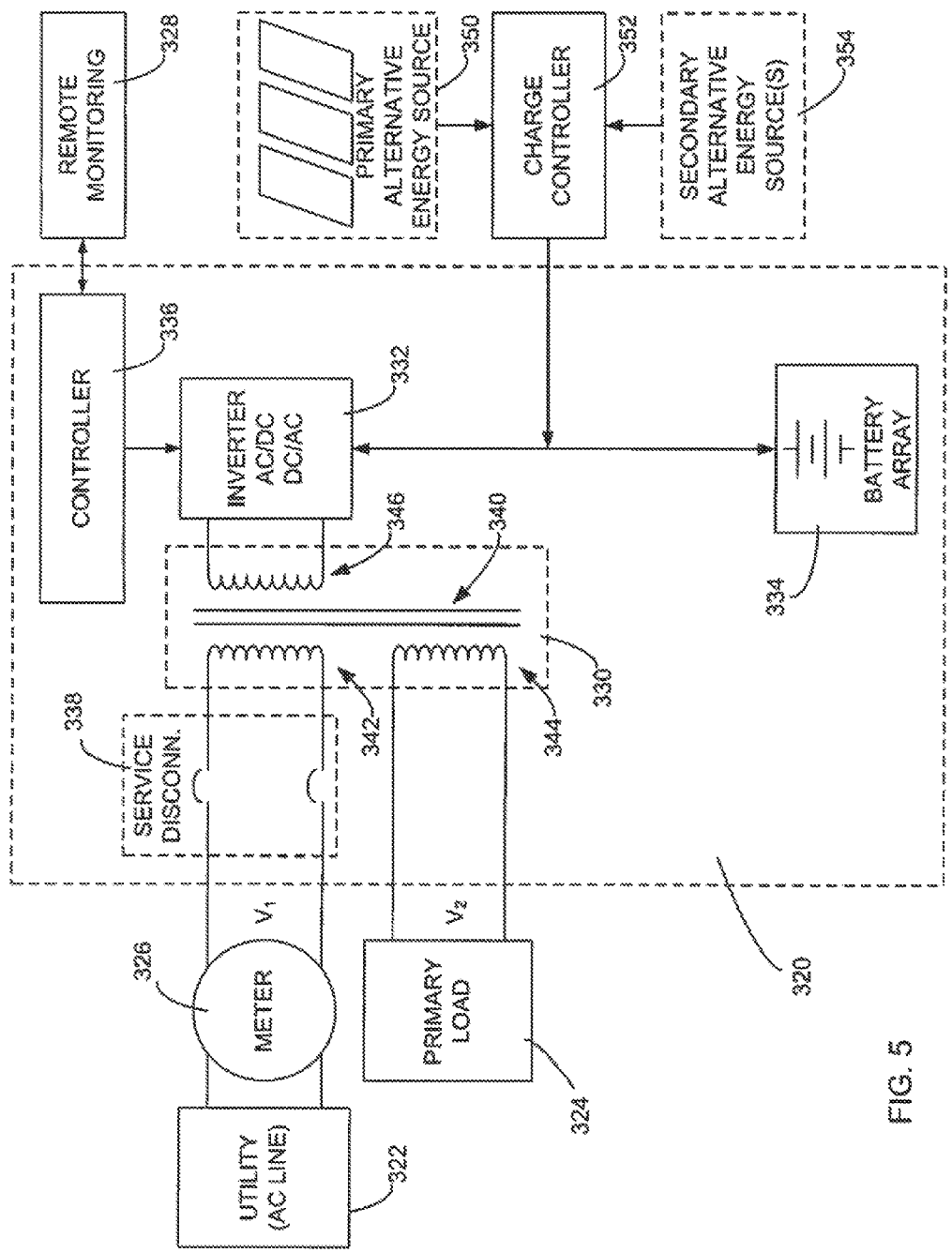
FIG. 5 is a block diagram of a second example uninterruptible power supply (UPS) of the present invention.

Referring now to FIG. 5 of the drawing, depicted therein is a second example UPS system 320 constructed in accordance with, and embodying, the principles of the present invention. The example UPS system 320 is adapted to obtain power from and supply power to a utility 322 and also to provide power to a primary load 324. As depicted in FIG. 5, a meter 326 may be connected between the utility 322 and the second example UPS system 320. In addition, UPS system such as the first and second example UPS system 20 and 320 may be used in connection with a remote monitoring system 328 as will be described in further detail below.

Like the first example UPS system 20, the second example UPS system 320 is designed to be used to provide power to a larger communications system (partly represented in FIG. 5 by the primary load) based on an AC utility power signal generated by a electrical utility. Examples of communications systems that might use the UPS system 320 are cable TV (CATV) systems, telephony systems, and cellular telephone systems. And like the first example UPS system 20, the communications system comprises at least a plurality (two or more) and typically many UPS systems, including a plurality of the second UPS systems 320. Only one of the third example UPS systems 320 is depicted in FIG. 5 for purposes of clarity.

Typically, the utility 322 operates at a standard voltage ($V_1$), while the primary load 324 operates at a different voltage level ($V_2$) than the utility 322. The transformer 330 thus steps the voltage up or down as necessary to perform the functions described below. In addition, the primary load 324 may operate in some environments (e.g., CATV systems) based on an AC power signal and in other environments (e.g., telephony systems) based on a DC power signal. As is conventional, the battery array 334 is one or more batteries that employ a DC power signal.

The second example UPS system 320 comprises transformer 330, an inverter circuit 332, a battery array 334, a controller 336, and a service disconnect 338. The service disconnect 338 may be operated to disconnect the transformer from the utility 322. The transformer 330 comprises a core 340, a first winding 342, a second winding 344, and an third winding 346.

In addition, the third example UPS system 320 comprises a primary alternative energy source 350 and a charge controller 352. The example alternative energy source 350 is an array of solar panels, and the charge controller 352 generates a charge signal appropriate for charging the battery array 334 based on the electrical output of the solar panels. Optionally, one or more secondary alternative energy sources 354, such as wind or water turbines, may be provided. The charge controller 352 may be configured to generate an appropriate charge signal additionally based on the electrical output of the secondary alternative energy source or sources 354, if available.

The third example UPS system 320 may be configured to operate in one or more of at least three operating modes. In a first (primary) operating mode, the UPS system 320 supplies power to the primary load 324 and charges the battery array 334 using power from the utility 322. In a second (standby) operating mode, the UPS system 320 supplies power to the primary load 324 using power stored in the battery array 334. In a third operating (peak shaving) mode, the UPS system 320 supplies power to the utility 322 using power stored in the battery array 334 and/or battery generated by the primary and/or secondary alternative energy sources 350 and 352. In the second example UPS system 320, the controller 336 determines whether the UPS system operates in the first, second, or third modes.

As discussed above with reference to the first example UPS 20, the use of the third operating mode allows the operator of the second example UPS system to optimize the use of assets (e.g., batteries, solar panels, wind turbines, water turbines) that may be underused or which may generate too much capacity for use by the primary load 324 and/or battery array 334.

In addition, the use of the remote monitoring system 328 allows the controller 336 to have up-to-date rate and other information for use in determining whether the UPS system 320 operates in the first, second, or third modes.

Figure 6:
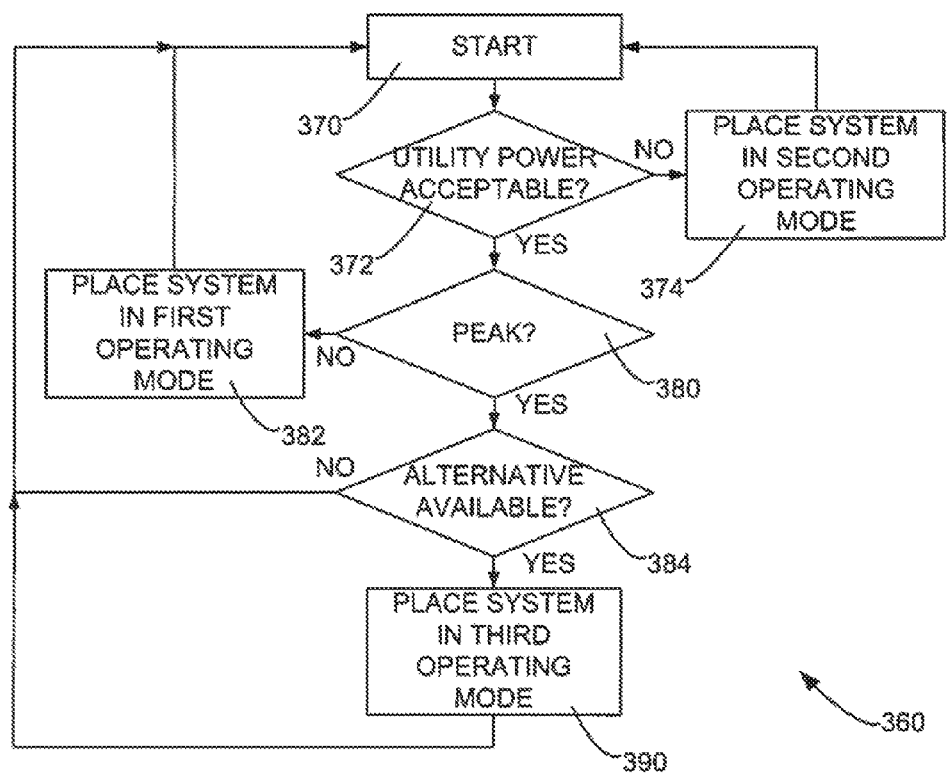
FIG. 6 is a flow chart illustrating one example of control logic for controlling the operation of the second example UPS to perform peak shaving.

Referring now to FIG. 6 of the drawing, depicted therein is a fourth example method 360 that may be implemented by the controller 336 of the second example UPS system 320. The fourth example method 360 begins at a initial step 370 and initially proceeds to a step 372 which determines whether the utility power signal generated by the utility 22 is within certain predetermined conditions (i.e., acceptable). If not, the method 360 places the UPS system 20 in the second operating mode at step 374 and returns to the initial step 370.

If the utility power signal generated by the utility 22 is within the predetermined conditions, the method 360 moves to step 380, which determines whether the utility 22 is supplying power at peak or non-peak rates. If the utility 22 is supplying power at non-peak rates, the method 360 places the system 20 in the first operating mode at step 382 and then returns to the initial step 370.

If the utility 22 is supplying power at peak rates, the second example method 360 proceeds to a step 384 at which it is determined whether an acceptable alternative energy source is available to the UPS system 320. The acceptable energy source may be one or more of the battery array 334, the primary alternative energy source 350, or (if used) the secondary alternative energy source 354. Factors such as availability of sunlight and the wear on the battery array 334 or the alternative energy sources 350 and 354 may be considered at step 384. The method 360 returns to the initial step 370 if the alternative is not available at step 384.

If the alternative is available at step 384, the method 360 proceeds to step 386 at which it is determined whether the difference between peak and non-peak rates is sufficient to justify the discharge/charge cycle on the battery array 334 required to sell power back to the utility 22. If step 386 determines that this margin is too low to justify the reduction in battery life, the method 360 returns to the initial step 370 and does not place the example UPS system 320 into the third operating mode.

If, on the other hand, the margin is within predetermined parameters (e.g., above a minimum), the method 360 places the system 320 in the third operating mode at step 390 and then returns to the initial step 370.

Figure 7:
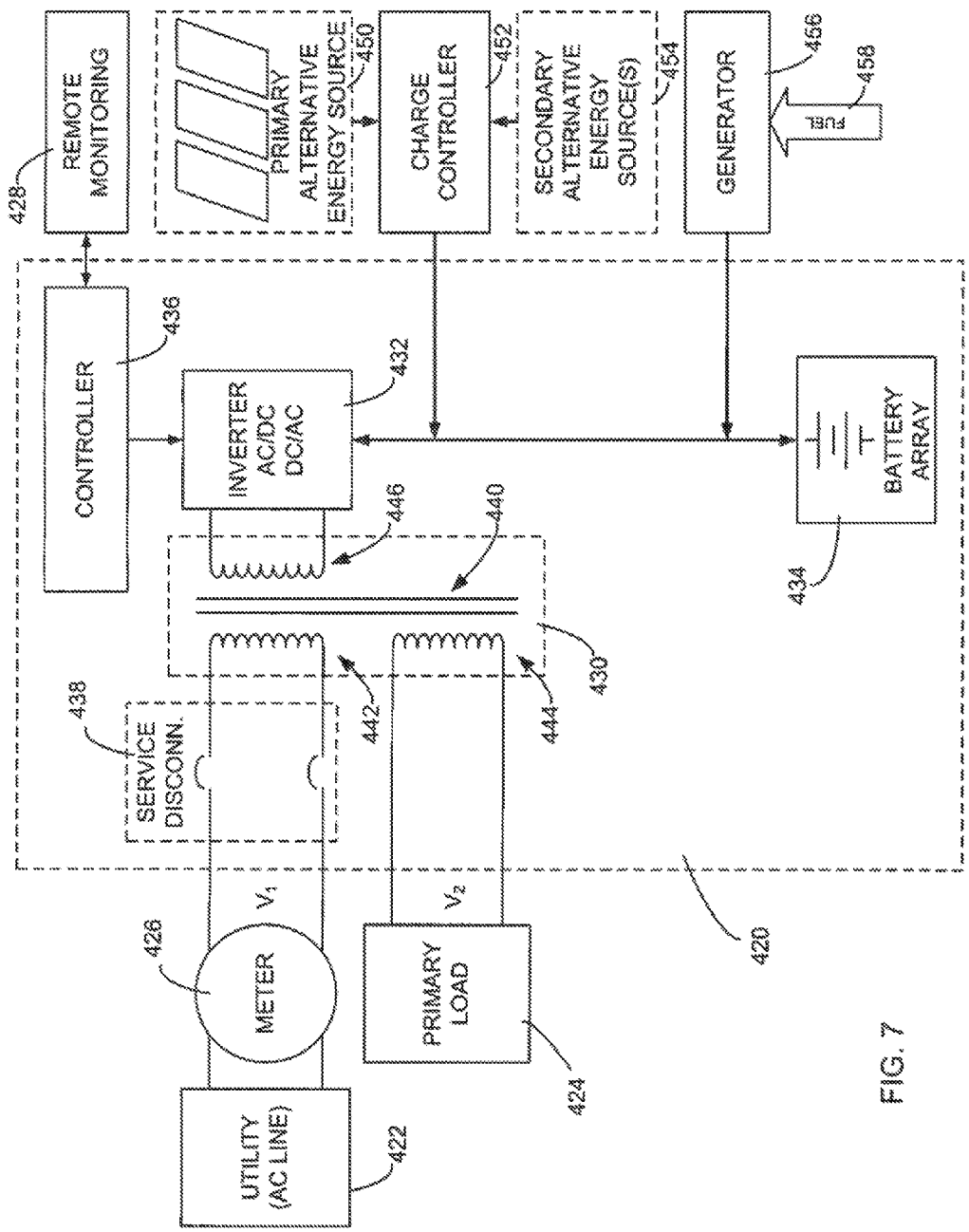
FIG. 7 is a block diagram of a third example uninterruptible power supply (UPS) of the present invention.

Referring now to FIG. 7 of the drawing, depicted therein is a third example UPS system 420 constructed in accordance with, and embodying, the principles of the present invention. The example UPS system 420 is adapted to obtain power from and supply power to a utility 422 and also to provide power to a primary load 424. As depicted in FIG. 7, a meter 426 may be connected between the utility 422 and the third example UPS system 420. In addition, the third example UPS system 420 may be used in connection with a remote monitoring system 428 as will be described in further detail below.

Like the first example UPS system 20, the third example UPS system 420 is designed to be used to provide power to a larger communications system (partly represented in FIG. 7 by the primary load) based on an AC utility power signal generated by a electrical utility. Examples of communications systems that might use the UPS system 420 are cable TV (CATV) systems, telephony systems, and cellular telephone systems. And like the first example UPS system 20, the communications system comprises at least a plurality (two or more) and typically many UPS systems, including a plurality of the second UPS systems 420. Only one of the third example UPS systems 420 is depicted in FIG. 7 for purposes of clarity.

Typically, the utility 422 operates at a standard voltage ($V_1$), while the primary load 424 operates at a different voltage level ($V_2$) than the utility 422. The transformer 430 thus steps the voltage up or down as necessary to perform the functions described below. In addition, the primary load 424 may operate in some environments (e.g., CATV systems) based on an AC power signal and in other environments (e.g., telephony systems) based on a DC power signal. As is conventional, the battery array 434 is one or more batteries that employ a DC power signal.

The third example UPS system 420 comprises transformer 430, an inverter circuit 432, a battery array 434, a controller 436, and a service disconnect 438. The service disconnect 438 may be operated to disconnect the transformer from the utility 422. The transformer 430 comprises a core 440, a first winding 442, a second winding 444, and an third winding 446.

In addition, the third example UPS system 420 comprises a primary alternative energy source 450 and a charge controller 452. The example alternative energy source 450 is an array of solar panels, and the charge controller 452 generates a charge signal appropriate for charging the battery array 434 based on the electrical output of the solar panels. Optionally, one or more secondary alternative energy sources 454, such as wind or water turbines, may be provided. The charge controller 452 may be configured to generate an appropriate charge signal additionally based on the electrical output of the secondary alternative energy source or sources 454, if available.

FIG. 7 further illustrates that the example UPS system 420 comprises a motor generator 456 for generating an electrical signal appropriate for charging the battery array 434 based on a supply of fuel 458.

The third example UPS system 420 may be configured to operate in one or more of at least three operating modes. In a first (primary) operating mode, the UPS system 420 supplies power to the primary load 424 and charges the battery array 434 using power from the utility 422. In a second (standby) operating mode, the UPS system 420 supplies power to the primary load 424 using power stored in the battery array 434. In a third operating (peak shaving) mode, the UPS system 420 supplies power to the utility 422 using power stored in the battery array 434 and/or battery generated by the primary and/or secondary alternative energy sources 450 and 454. In the third example UPS system 420, the controller 436 determines whether the UPS system operates in the first, second, or third modes.

As discussed above with reference to the first example UPS 20, the use of the third operating mode allows the operator of the third example UPS system to optimize the use of assets (e.g., batteries, solar panels, wind turbines, water turbines, motor generators) that may be underused or which may generate too much capacity for use by the primary load 424 and/or battery array 434.

In addition, the use of the remote monitoring system 428 allows the controller 436 have up-to-date rate and other information for use in determining whether the UPS system 420 operates in the first, second, or third modes.

The third example UPS system 420 may be operated using a method similar to the example method 360 discussed above. In particular, If it is determined at step 380 that the utility 22 is supplying power at peak rates, the method also considers at step 384 whether the cost of the fuel 458 required to operate the motor generator 456 renders the motor generator 456 an acceptable alternative energy source for operating the UPS system 420 in the third mode.

What is claimed is:

1. An uninterruptible power supply adapted to be connected between an AC line and a load, comprising:
    a battery system for storing battery power;
    an inverter operatively connected to the battery system;
    a transformer comprising
        a primary winding adapted to be connected to the AC line,
        a load winding adapted to be connected to the load, and
        an inverter winding operatively connected to the inverter; and
    a controller for controlling the inverter to operate in
        a first mode in which the inverter supplies power to the battery system,
        a second mode in which the inverter supplies power to the load winding using battery power stored in the battery system, and
        a third mode in which the inverter supplies power to the primary winding using battery power stored in the battery system.

2. An uninterruptible power supply as recited in claim 1, in which the controller controls the inverter to operate in one the first, second, and third modes when at least one characteristic of a primary power signal present at the primary winding is within certain predetermined conditions.

3. An uninterruptible power supply as recited in claim 2, in which the controller controls the inverter to operate in one of the first, second, and third modes in response to a price associated with the primary power signal.

4. An uninterruptible power supply as recited in claim 2, in which, when the controller controls the inverter to operate in the third mode, the controller controls the inverter to operate in one of the first, second, and third modes by comparing a price associated with the primary power signal and a cost associated with reduction of life of the battery system.

5. An uninterruptible power supply as recited in claim 2, in which the controller controls the inverter to operate in one of the first, second, and third modes by measuring a voltage of the primary power signal.

6. An uninterruptible power supply as recited in claim 2, in which the controller controls the inverter to operate in one of the first and third modes when the primary power signal is present.

7. An uninterruptible power supply as recited in claim 2, in which the controller controls the inverter to operate in:
    the first and third modes mode when at least one characteristic of the primary power signal is within a set of predetermined conditions and by comparing a price associated with the primary power signal and a cost associated with reduction of life of the battery system; and
    the second mode when at least one characteristic of the primary power signal is not within the set of predetermined conditions.

8. An uninterruptible power supply as recited in claim 1, in which the controller controls the inverter to operate in the first, second, and third modes by measuring at least one characteristic of the battery system.

9. An uninterruptible power supply as recited in claim 1, in which the primary winding is connected to a utility power source.

10. An uninterruptible power supply as recited in claim 1, further comprising at least one secondary source for providing secondary power, wherein:
    in the first mode, power is supplied to the battery system using secondary power from the at least one secondary power source;
    in the second mode, power is supplied using secondary power from the at least one secondary power source; and
    in the third mode, power is supplied using secondary power from the at least one secondary power source.

11. An uninterruptible power supply as recited in claim 1, further comprising at least one generator for providing generator power, wherein:
    in the first mode, power is supplied using generator power from the at least one generator;
    in the second mode, power is supplied using generator power from the at least one generator; and
    in the third mode, power is supplied using generator power from the at least one generator.

12. A method of supplying uninterruptible electric power to a load comprising the steps of:
    providing a battery system for storing battery power;
    operatively connecting an inverter to the battery system;
    providing a transformer comprising a primary winding configured to be connected to an AC line, a load winding configured to be connected to the load, and an inverter winding;
    operatively connecting the inverter winding to the inverter; and
    controlling the inverter to operate in
        a first mode in which the inverter supplies power to the battery system from the primary winding,
        a second mode in which the inverter supplies power to the load winding using battery power stored in the battery system, and
        a third mode in which the inverter supplies power to the primary winding using battery power stored in the battery system.

13. A method as recited in claim 12, in which inverter is controlled to operate in the first, second, and third modes when at least one characteristic of a primary power signal present at the primary winding is within certain predetermined conditions.

14. A method as recited in claim 12, in which the inverter is controlled to operate in the first, second, and third modes by measuring at least one characteristic of the battery system.

15. An uninterruptible power supply adapted to be connected between an AC line and a load, comprising:
- a battery system for storing battery power;
- an inverter operatively connected to the battery system;
- a transformer comprising
  - a primary winding adapted to be connected to the AC line,
  - a load winding adapted to be connected to the load, and
  - an inverter winding operatively connected to the inverter; and
- a controller for controlling the inverter to operate based on at least one characteristic of a primary power signal present at the primary winding in
  - a first mode in which the inverter supplies power to the battery system,
  - a second mode in which the inverter supplies power to the load winding using battery power stored in the battery system, and
  - a third mode in which the inverter supplies power to the primary winding using battery power stored in the battery system.

16. An uninterruptible power supply as recited in claim 15, in which the controller controls the inverter to operate:
- in the first and third modes mode when at least one characteristic of the primary power signal is within a set of predetermined conditions and by comparing a price associated with the primary power signal and a cost associated with reduction of life of the battery system; and
- in the second mode when at least one characteristic of the primary power signal is not within the set of predetermined conditions.

17. An uninterruptible power supply as recited in claim 16, in which the controller controls the inverter to operate in the first, second, and third modes by measuring at least one characteristic of the battery system.

18. An uninterruptible power supply as recited in claim 15, in which the primary source is a utility.

19. An uninterruptible power supply as recited in claim 18, further comprising at least one secondary source for providing secondary power, wherein:
- in the first mode, power is supplied using secondary power from the at least one secondary power source;
- in the second mode, power is supplied using secondary power from the at least one secondary power source; and
- in the third mode, power is supplied using secondary power from the at least one secondary power source.

20. An uninterruptible power supply as recited in claim 19, further comprising at least one generator for providing generator power, wherein:
- in the first mode, power is selectively supplied to the battery using generator power from the at least one generator;
- in the second mode, power is selectively supplied using generator power from the at least one generator; and
- in the third mode, power is selectively supplied using generator power from the at least one generator.

* * * * *